(12) United States Patent
Lin et al.

(10) Patent No.: US 7,714,645 B2
(45) Date of Patent: May 11, 2010

(54) OFFSET CANCELLATION OF A SINGLE-ENDED OPERATIONAL AMPLIFIER

(75) Inventors: Shui-Mu Lin, Longjing Township, Taichung County (TW); Tsung-Wei Huang, Jubei (TW); Jien-Sheng Chen, Toufen Township, Miaoli County (TW); Kwan-Jen Chu, Hsinchu (TW)

(73) Assignee: Richtek Technology Corp., Hsinchu (TW)

( * ) Notice: Subject to any disclaimer, the term of this patent is extended or adjusted under 35 U.S.C. 154(b) by 15 days.

(21) Appl. No.: 12/292,061

(22) Filed: Nov. 12, 2008

(65) Prior Publication Data
US 2009/0128238 A1    May 21, 2009

(30) Foreign Application Priority Data
Nov. 16, 2007    (TW)    ............................ 96143509 A

(51) Int. Cl.
*H03F 1/02* (2006.01)
*H03F 3/45* (2006.01)

(52) U.S. Cl. ........................................... 330/9; 330/260

(58) Field of Classification Search ..................... 330/9, 330/99–104, 112, 253, 257, 260, 293
See application file for complete search history.

(56) References Cited

U.S. PATENT DOCUMENTS

| | | | |
|---|---|---|---|
| 6,194,967 B1 * | 2/2001 | Johnson et al. | ............. 330/288 |
| 7,091,773 B1 * | 8/2006 | Brunn et al. | ................ 330/260 |
| 2004/0008086 A1 * | 1/2004 | Sanchez et al. | ............. 330/260 |

* cited by examiner

*Primary Examiner*—Khanh V Nguyen
(74) *Attorney, Agent, or Firm*—Rosenberg, Klein & Lee

(57) ABSTRACT

A single-ended operational amplifier includes an output stage, a first transconductance amplifier and a second transconductance amplifier. In an offset cancellation mode, two inputs of the first transconductance amplifier are supplied with a reference voltage to sink two currents from two inputs of the output stage respectively, the output stage generates a third current according to the difference between the two currents to charge a capacitor, and the second transconductance amplifier generates two currents according to the voltage in the capacitor to make currents in the two inputs of the output stage equal to each other, thereby canceling the offset of the single-ended operational amplifier.

12 Claims, 13 Drawing Sheets

US 7,714,645 B2

OFFSET CANCELLATION OF A SINGLE-ENDED OPERATIONAL AMPLIFIER

FIELD OF THE INVENTION

The present invention is related generally to a single-ended operational amplifier and, more particularly, to the offset cancellation of a single-ended operational amplifier for current regulators.

BACKGROUND OF THE INVENTION

While electronic devices are becoming more and more sophisticated, any minute error can have unexpected influence on the operations of these devices. Consequently, increasingly heightened requirements are being imposed on accuracy of electronic devices. FIG. 1 is a circuit diagram of a conventional current regulator 10, in which a current source 12 is connected between a voltage source VDD and a drain of a transistor 18 to provide a reference current IREF, a single-ended operational amplifier 16 has a non-inverting input connected to the drain of the transistor 18 and an output connected to a gate of the transistor 18 to establish a negative feedback path therewith, and a transistor 19 has a drain connected to an inverting input of the single-ended operational amplifier 16 and a gate connected to the output of the single-ended operational amplifier 16 to establish a positive feedback path therewith, and mirrors the current in the transistor 18 to generate a load current ILED for a light-emitting diode (LED) 14. In FIG. 1, the voltage source VOS at the inverting input of the single-ended operational amplifier 16 represents the offset effect of the single-ended operational amplifier 16. FIG. 2 is a diagram to illustrate the I-V curve of the current regulator 10 shown in FIG. 1. Ideally, the single-ended operational amplifier 16 has no offset and the relationship between the load current ILED and the supply voltage VDD is piecewise linear as shown by the curve 22. In this case, because of the constant forward voltage of the LED 14, the voltage at the drain of the transistor 19 decreases with the decrease of the supply voltage VDD. Due to the virtual short between the inputs of the single-ended operational amplifier 16, the voltages at the drains of the transistors 18 and 19 will be equal to each other, and thus the load current ILED will remain constant, unless the supply voltage VDD decreases beyond a threshold Vth. After this point of VDD=Vth, the single-ended operational amplifier 16 can no longer keep the voltages at the drains of the transistors 18 and 19 equal to each other, and the load current ILED will decrease with the decreasing supply voltage VDD. However, the single-ended operational amplifier 16 may have offset due to unmatched components thereof. If the offset voltage VOS is positive, the load current ILED will have a peak, as shown by the curve 20 of FIG. 2. On the contrary, if the offset voltage VOS is negative, the load current ILED will fall down in advance before the supply voltage VDD becomes lower than the threshold Vth, as shown by the curve 24 of FIG. 2.

FIG. 3 is a circuit diagram of another conventional current regulator 30, in which a current source 32 is connected between a voltage source VDD and a resistor REF to provide a reference current IREF, and a single-ended operational amplifier 36 has an inverting input connected to the node A between the current source 32 and the resistor REF, an output connected to a gate of a transistor 38, and a non-inverting input connected to the node B between a source of the transistor 38 and a resistor RSET. Because of the virtual short between the inputs of the single-ended operational amplifier 36, the voltage at the node B will be equal to that at the node A, and this voltage VB will determine a load current ILED for a LED 34 serially connected to the transistor 38 and resistor RSET. In FIG. 3, the voltage source VOS at the inverting input of the single-ended operational amplifier 36 represents the offset effect of the single-ended operational amplifier 36, and FIG. 4 is a diagram to illustrate the relationship between the load current ILED and the reference current IREF in the current regulator 30 due to the offset voltage VOS. Ideally, the single-ended operational amplifier 36 has no offset and the curve representing the relationship between the load current ILED and the reference current IREF is a straight line passing through the origin, as shown by the curve 42 of FIG. 4. If the single-ended operational amplifier 36 has a positive offset, the relationship curve of the load current ILED and the reference current IREF will shift upward, as shown by the curve 40 of FIG. 4; while if the single-ended operational amplifier 36 has a negative offset, the relationship curve of the load current ILED and the reference current IREF will shift downward, as shown by the curve 44 of FIG. 4.

As shown in FIGS. 2 and 4, the offset voltage VOS of the single-ended operational amplifiers 16 and 36 may result in error in the load current ILED provided by the current regulators 10 and 30, so it is necessary to cancel the offset VOS of the single-ended operational amplifiers 16 and 36 in order to provide accurate current ILED by the current regulators 10 and 30. For offset cancellation of operational amplifiers, there have been proposed many arts, for example, "Design of Analog CMOS Integrated Circuits", Pages 474-476, McGraw-Hill International Publications, 2001, and U.S. Pat. Nos. 6,194,962, 5,061,900, 6,459,335, 6,573,783 and 5,550,512.

FIGS. 5 and 6 show two states of a conventional operational amplifier 50 with offset cancellation mechanism, respectively, in which FIG. 5 is the configuration of the operational amplifier 50 in normal operation mode, and FIG. 6 is the configuration of the operational amplifier 50 in offset cancellation mode. The operational amplifier 50 includes transconductance amplifiers 52 and 56 having their outputs 5206, 5208 and 5606, 5608 connected together respectively, an output stage 54 having inputs 5402 and 5404 respectively connected to the outputs 5206, 5606 and 5208, 5608, and outputs 5406 and 5408 respectively connected to outputs 5006 and 5008 of the operational amplifier 50, switches S1 and S2 connected between two inputs 5202 and 5204 of the transconductance amplifier 52 and a voltage source VCM, respectively, switches S3 and S4 connected between inputs 5002 and 5004 of the operational amplifier 50 and the inputs 5202 and 5204 of the transconductance amplifier 52, respectively, switches S5 and S6 connected between the outputs 5406 and 5408 of the output stage 54 and inputs 5602 and 5604 of the transconductance amplifier 56, respectively, and capacitors C1 and C2 connected between the inputs 5602 and 5604 of the transconductance amplifier 56 and a ground terminal GND.

FIG. 7 shows the circuit of the operational amplifier 50 in detail. In the offset cancellation mode, as shown in FIGS. 6 and 7, the switches S1, S2, S5 and S6 are on and the switches S3 and S4 are off. Therefore, the inputs 5202 and 5204 of the transconductance amplifier 52 are supplied with the voltage VCM, and the inputs 5602 and 5604 of the transconductance amplifier 56 are connected to the outputs 5406 and 5408 of the output stage 54 respectively. The transconductance amplifier 52 includes a differential input pair that establishes currents I1 and I2 in the outputs 5206 and 5208 according to the voltages at the inputs 5202 and 5204. In the output stage 54, current sources 5410 and 5412 are connected to the inputs 5402 and 5404 of the output stage 54 respectively, to source equal currents I3 and I4 that are partially sink by the transconductance amplifier 52 by the currents I1 and I2 so as to leave currents I5 and I6. However, even the inputs 5202 and 5204 of the transconductance amplifier 52 are connected to the same voltage source VCM, due to the offset voltage VOS in the input 5202 of the transconductance amplifier 52, the currents I1 and I2 are actually unequal to each other and consequently, the currents I5 and I6 are unequal to each other. As a result, the voltages at the outputs 5406 and 5408 of the output stage 54 are unequal to each other. The capacitors C1 and C2 store the voltages at the outputs 5406 and 5408 of the output stage 54 respectively, and the transconductance amplifier 56 includes a differential input pair that sinks currents I7 and I8 from the inputs 5402 and 5404 of the output stage 54 according to the voltages at the outputs 5406 and 5408 of the output stage 54, so as to make the currents I5 and I6 equal to each other. Then, the operational amplifier 50 is switched to the normal operation mode, where the switches S3 and S4 are on and the switches S1, S2, S5 and S6 are off, as shown in FIG. 5. In this state, the voltages stored in the capacitors C1 and C2 will make the transconductance amplifier 56 sinking the currents I7 and I8 to cancel the effect caused by the offset voltage VOS. However, the operational amplifier 50 is a two-ended operational amplifier, so it is inapplicable to the current regulators 10 and 30 shown in FIGS. 1 and 2 respectively.

Therefore, it is desired a single-ended operational amplifier which is offset cancelled.

SUMMARY OF THE INVENTION

An object of the present invention is to provide a single-ended operational amplifier with offset cancellation.

Another object of the present invention is to provide an offset cancellation method for a single-ended operational amplifier.

Yet another object of the present invention is to provide a current regulator with offset cancellation.

According to the present invention, a single-ended operational amplifier which can operate at a normal operation mode and an offset cancellation mode, includes an output stage having a first input, a second input and a first output, a first transconductance amplifier having a third input, a fourth input, a second output connected to the first input, and a third output connected to the second input, a second transconductance amplifier having a fifth input, a sixth input, a fourth output connected to the first input, and a fifth output connected to the second input, and a capacitor connected between the fifth and sixth inputs. In the normal operation mode, the third and fourth inputs are connected to two inputs of the single-ended operational amplifier respectively, and the first output is connected to an output of the single-ended operational amplifier. In the offset cancellation mode, the third and fourth inputs are supplied with a reference voltage, and the first output is connected to the sixth input.

According to the present invention, in an offset cancellation method for a single-ended operational amplifier including an output stage, a first transconductance amplifier and a second transconductance amplifier, a reference voltage is supplied to two inputs of the first transconductance amplifier to sink a first current and a second current from two inputs of the output stage respectively, the output stage generates a third current according to a difference between the first current and the second current to charge a capacitor, and the second transconductance amplifier generates a third current and a fourth current at its outputs according to a voltage in the capacitor respectively, to make currents in the two inputs of the output stage equal to each other.

According to the present invention, a current regulator includes a single-ended operational amplifier having a non-inverting input, an inverting input and an output, a first transistor having a gate connected to the output of the single-ended operational amplifier, and a drain connected to the non-inverting input of the single-ended operational amplifier, to thereby establish a negative feedback path, a second transistor having a gate connected to the output of the single-ended operational amplifier, and a drain connected to the inverting input of the single-ended operational amplifier, to thereby establish a positive feedback path, and mirroring a current in the first transistor to generate a load current for a load, a current source providing a reference current to the first transistor, and a delay circuit in the positive feedback path for delaying a positive feedback to avoid the positive feedback faster than a negative feedback.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAIL DESCRIPTION OF THE INVENTION

Figure 1:
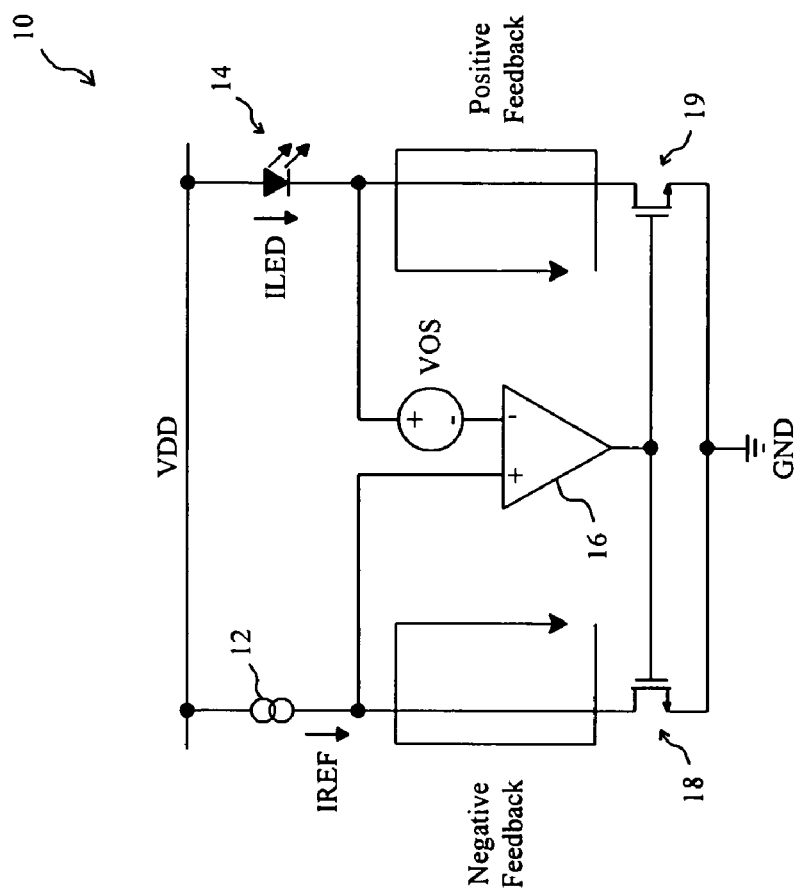
FIG. 1 is a circuit diagram of a conventional current regulator.
Figure 2:
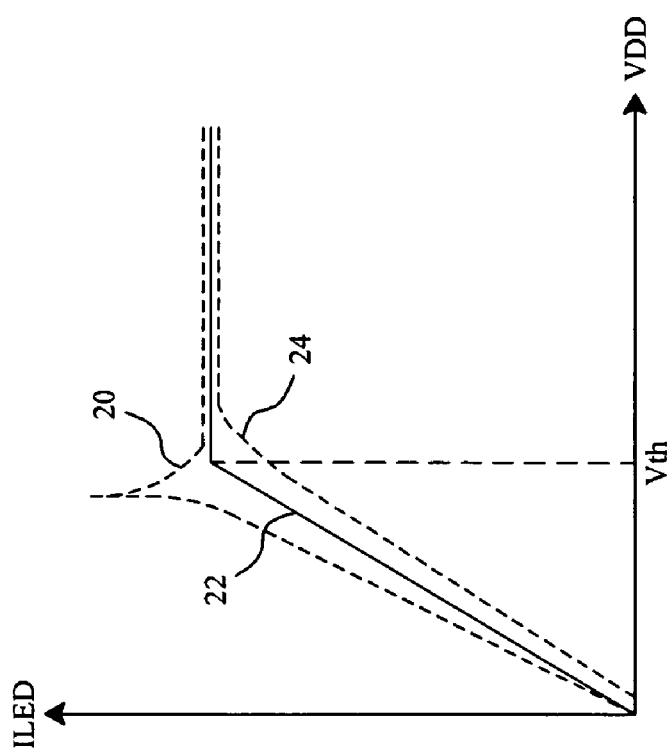
FIG. 2 is a diagram to illustrate the I-V curve of the current regulator shown in FIG. 1.
Figure 3:
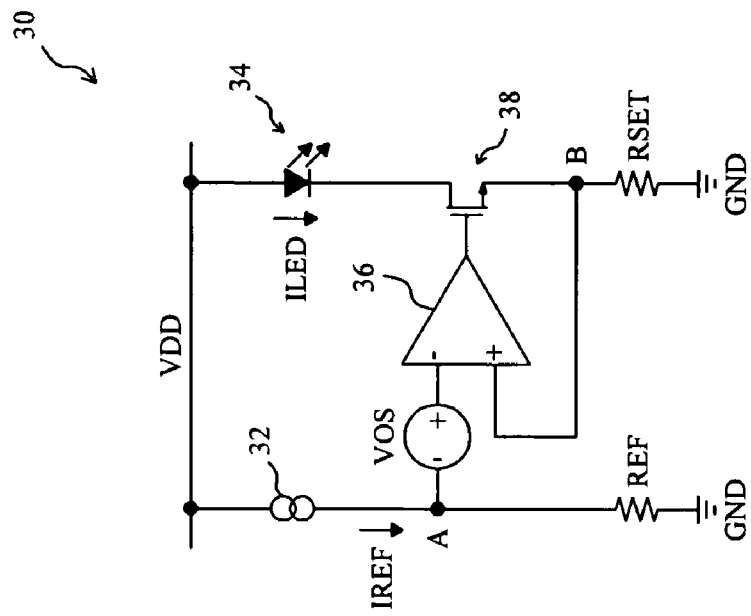
FIG. 3 is a circuit diagram of another conventional current regulator.
Figure 4:
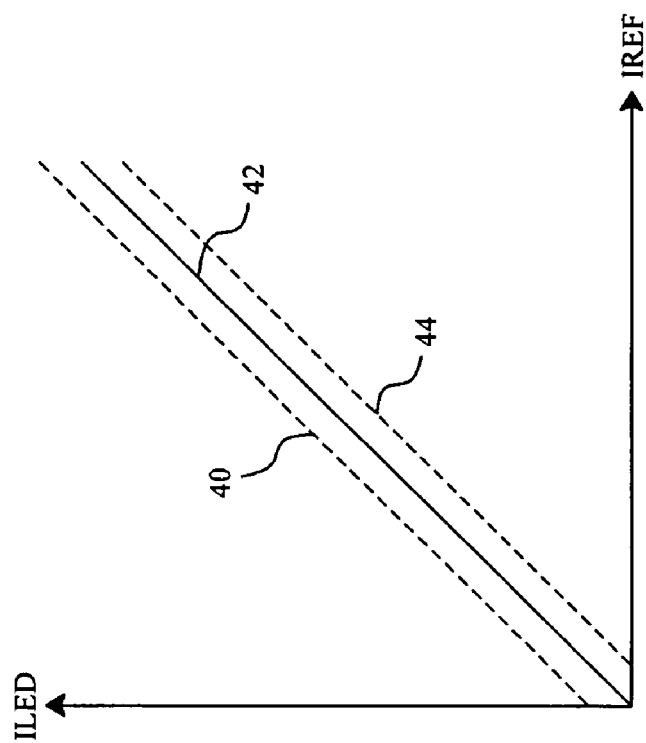
FIG. 4 is a diagram to illustrate the relationship between the load current and the reference current in the current regulator of FIG. 3.
Figure 5:
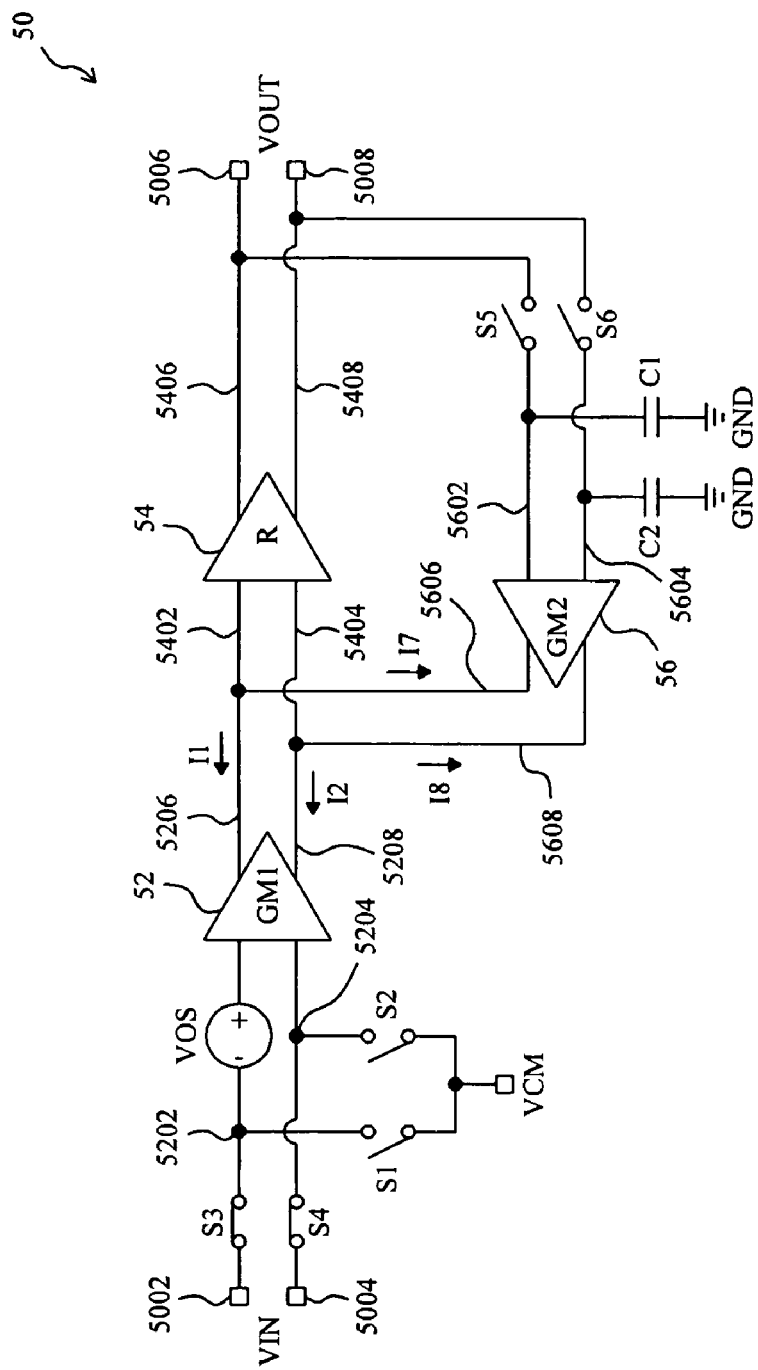
FIG. 5 is the configuration of a conventional operational amplifier with offset cancellation mechanism in normal operation mode.
Figure 6:
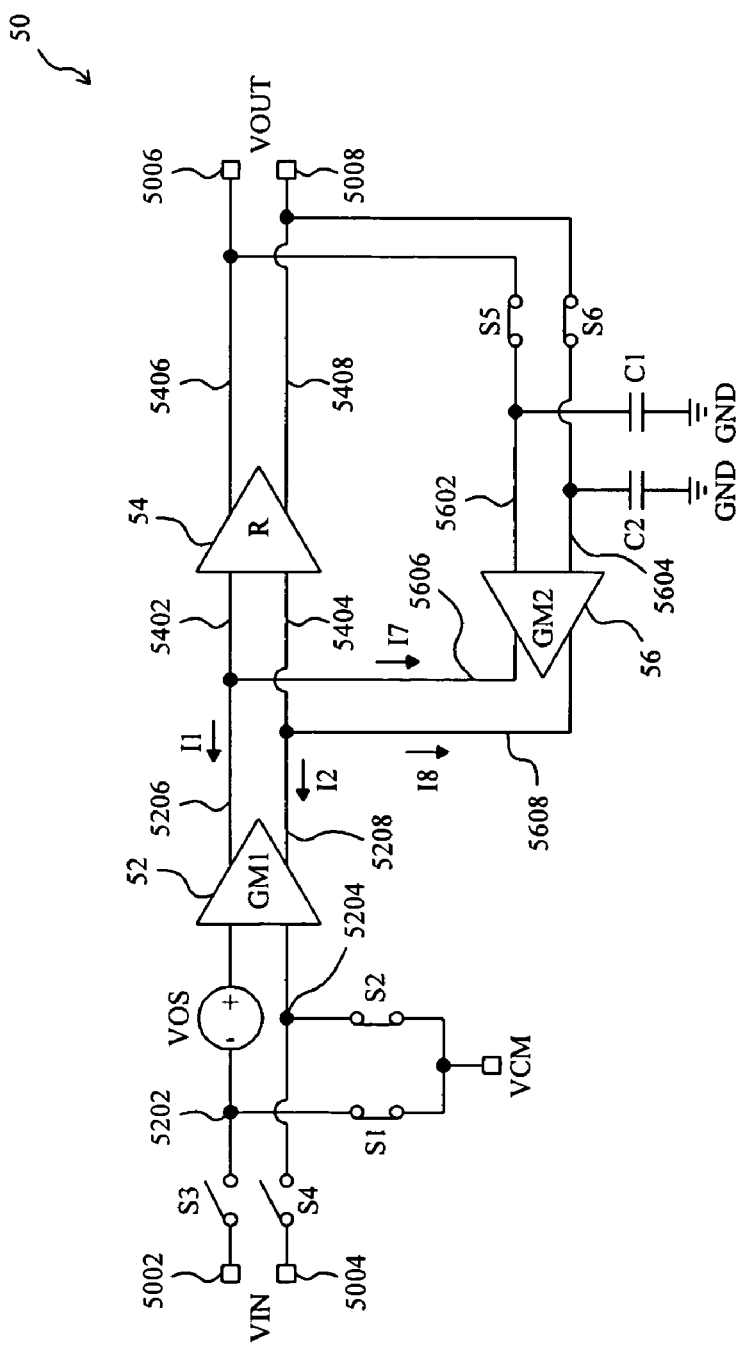
FIG. 6 is the configuration of the operational amplifier shown in FIG. 5 in offset cancellation mode.
Figure 7:
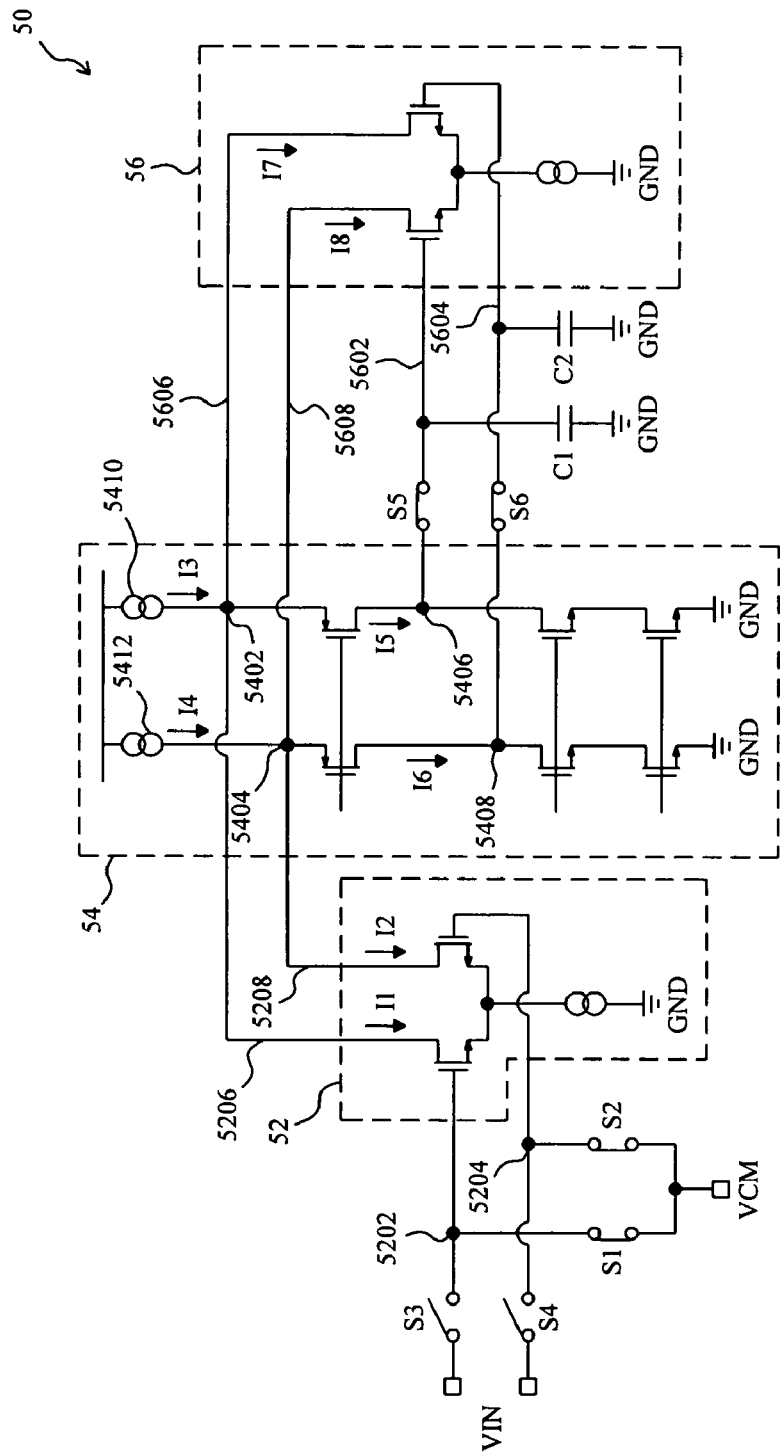
FIG. 7 is a diagram showing further detail circuit of the operational amplifier of FIG. 5.
Figure 8:
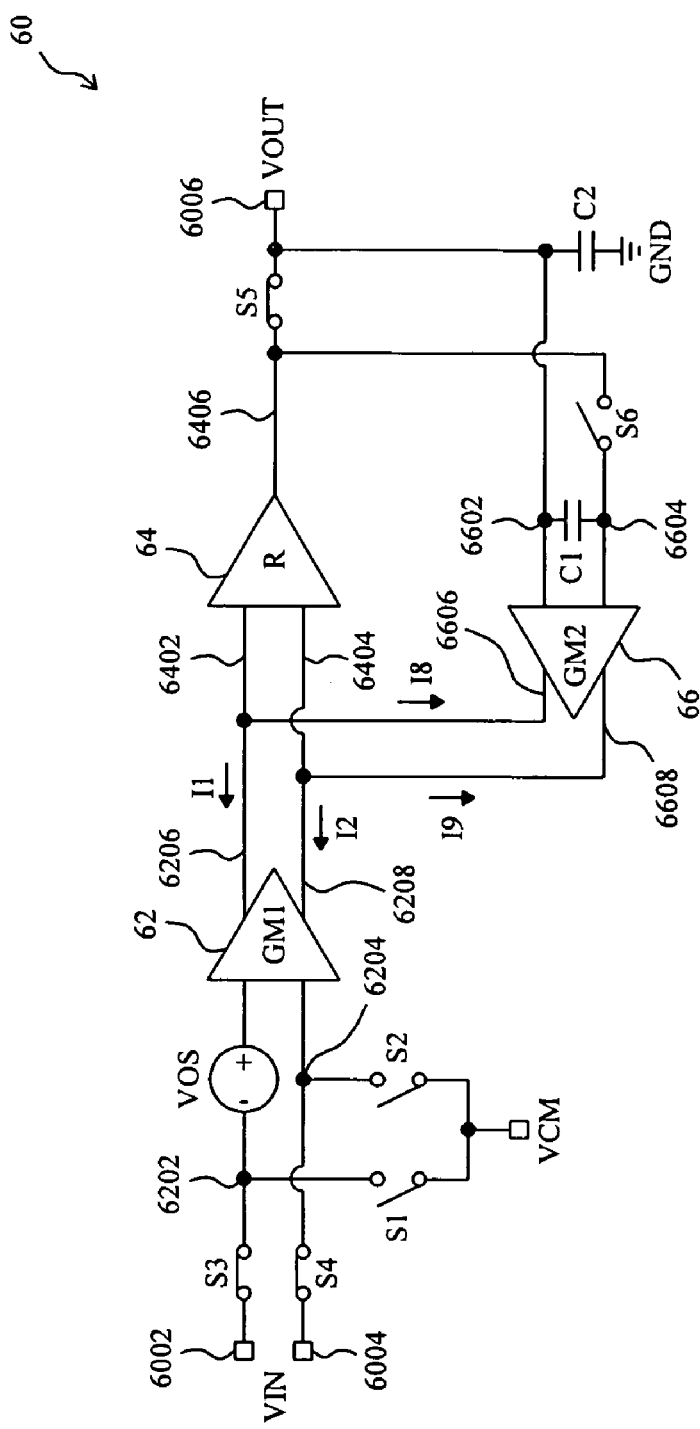
FIG. 8 is the configuration of a single-ended operational amplifier in normal operation mode according to the present invention.
Figure 9:
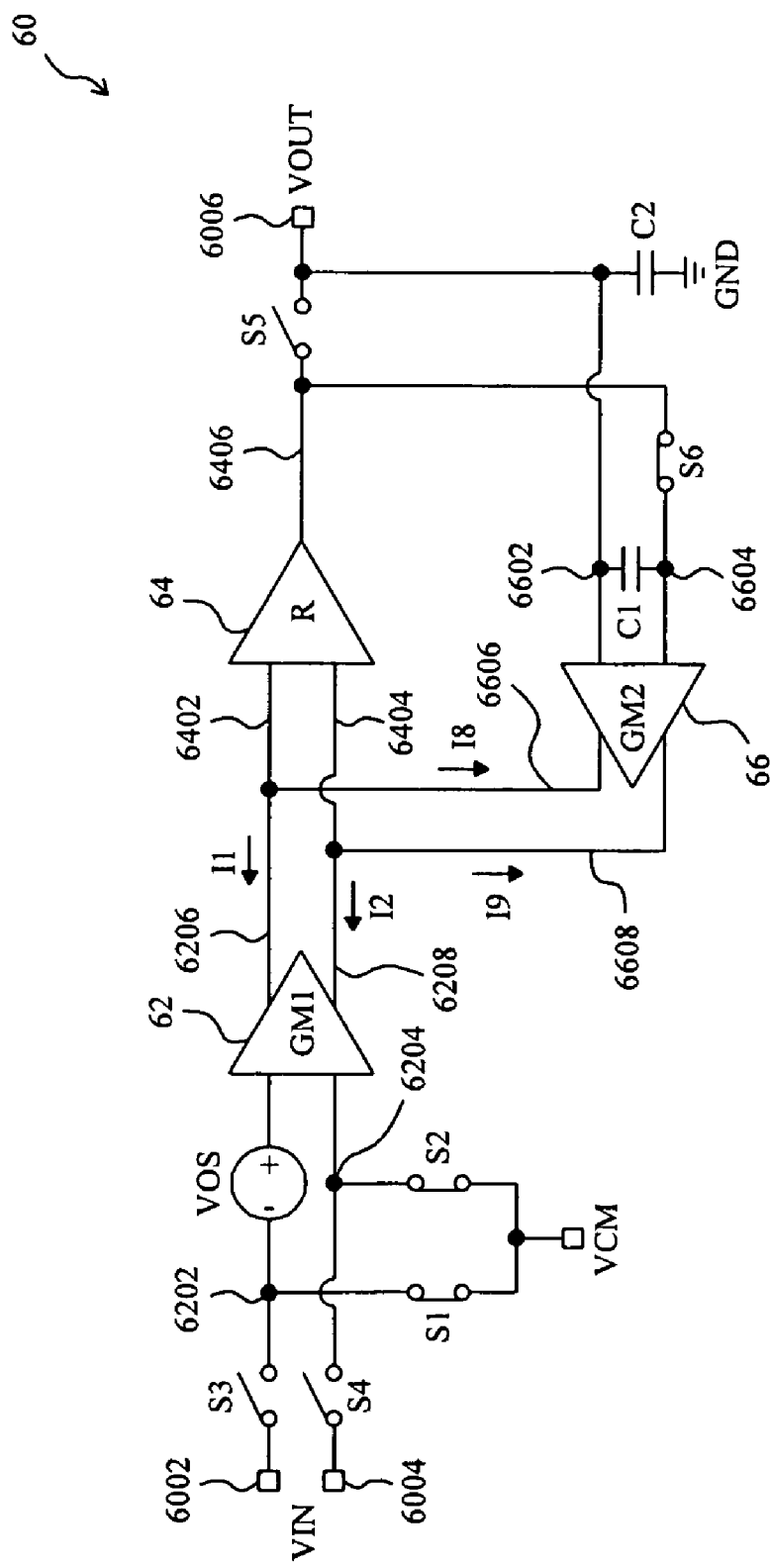
FIG. 9 is the configuration of the single-ended operational amplifier of FIG. 6 in offset cancellation mode according to the present invention.

FIGS. 8 and 9 show a single-ended operational amplifier 60 according to the present invention, in which FIG. 8 is the configuration of the single-ended operational amplifier 60 in normal operation mode, and FIG. 9 is the configuration of the single-ended operational amplifier 60 in offset cancellation mode. The single-ended operational amplifier 60 includes transconductance amplifiers 62 and 66 having their outputs 6206, 6208 and 6606, 6608 connected together respectively, an output stage 64 having inputs 6402 and 6404 respectively connected to the outputs 6206, 6606 and 6208, 6608, switches S1 and S2 connected between the inputs 6202 and 6204 and a voltage source VCM respectively, switches S3 and S4 connected between the inputs 6202 and 6204 and inputs 6002 and 6004 of the single-ended operational amplifier 60, a switch S5 connected between an output 6406 of the output stage 64 and an output 6006 of the single-ended operational amplifier 60, a switch S6 connected between the output 6406 and the input 6604, a capacitor C1 connected between the inputs 6602 and 6604, and a capacitor C2 connected between the output 6006 and a ground terminal GND for stabilizing an output voltage VOUT.

Figure 10:
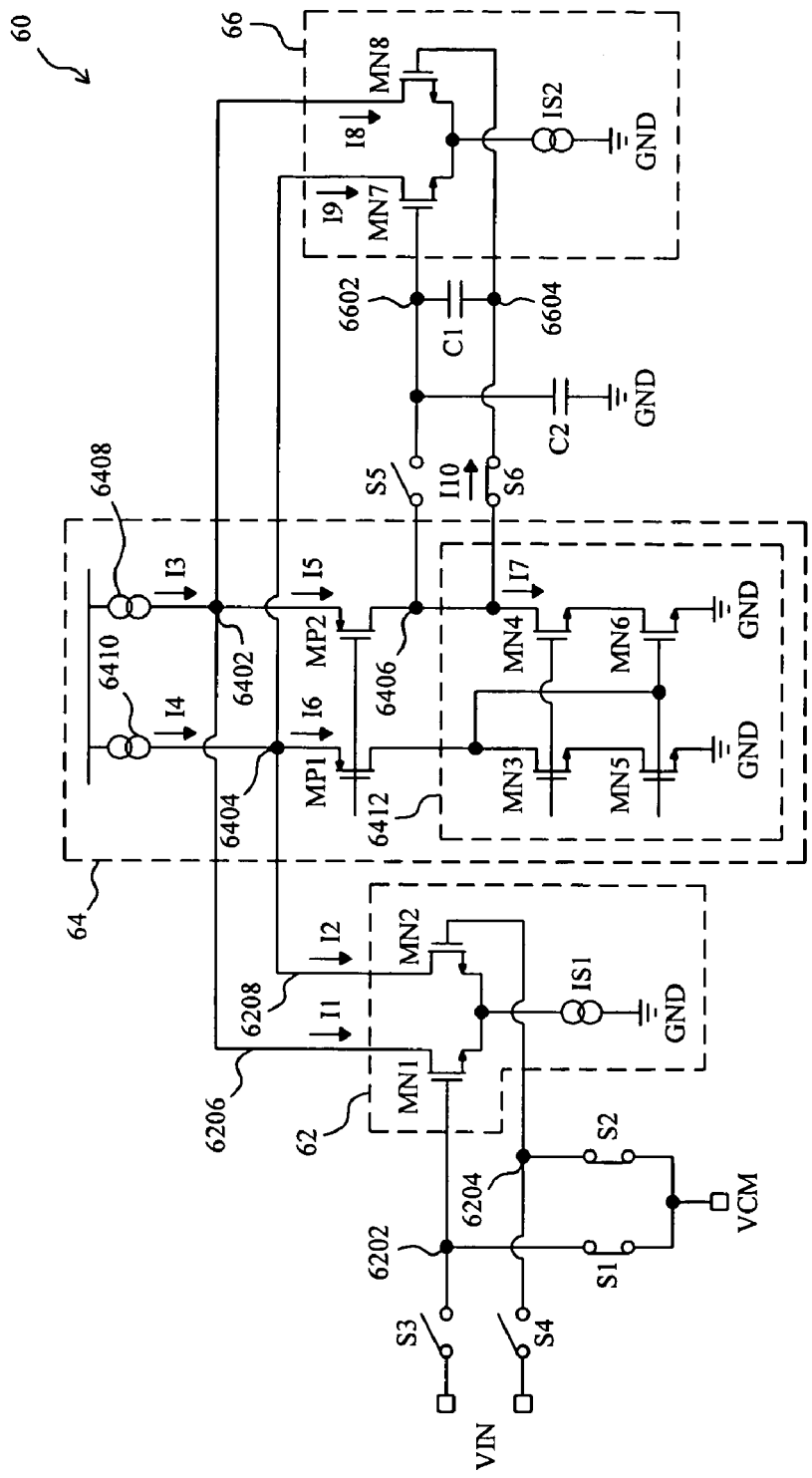
FIG. 10 is a diagram showing further detail circuit of the single-ended operational amplifier of FIG. 8.

FIG. 10 shows the circuit of the single-ended operational amplifier 60 in detail. In the offset cancellation mode, as shown in FIGS. 9 and 10, the switches S1, S2 and S6 are on and the switches S3, S4 and S5 are off, and therefore, the inputs 6202 and 6204 of the transconductance amplifier 62 are supplied with the voltage VCM, and the input 6604 of the transconductance amplifier 66 is connected to the output 6406 of the output stage 64. The transconductance amplifier 62 includes a differential input pair composed of transistors MN1 and MN2 and a current source IS1 to establish currents I1 and I2 at the outputs 6206 and 6208 according to the voltages at the inputs 6202 and 6204. In the output stage 64, as shown in FIG. 10, current sources 6408 and 6410 source equal currents I3 and I4 to the inputs 6402 and 6404 of the output stage 64. The transconductance amplifier 62 sinks currents I1 and I2 from the currents I3 and I4 respectively, to determine currents I5 and I6. The current I5 flows toward the output 6406 of the output stage 64. Though the inputs 6202 and 6204 of the transconductance amplifier 62 are supplied with the same voltage VCM, the currents I1 and I2 are actually unequal to each other due to the offset voltage VOS at the input 6202 of the transconductance amplifier 62, and the currents I5 and I6 are consequently unequal to each other. In the output stage 64, a current mirror 6412 has a reference branch connected to the input 6404 and a mirror branch connected to the output 6406 for mirroring the current I6 to generate a current I7, and the difference I10 between the currents I5 and I7 charges the capacitor C1 through the switch S6. The transconductance amplifier 66 includes a differential input pair composed of transistors MN7, MN8 and a current source IS2 to sink currents I8 and I9 from the inputs 6402 and 6404 of the output stage 64 according to the voltage in the capacitor C1 so as to make currents in the inputs 6402 and 6404 of the output stage 64 equal to each other, thereby canceling the effect caused by the offset voltage VOS.

After the single-ended operational amplifier 60 switches to the normal operation mode, the switches S1, S2 and S6 are off and the switches S3, S4, and S5 are on, as shown in FIG. 8. Therefore, the outputs 6202 and 6204 of the transconductance amplifier 62 are connected to the inputs 6002 and 6004 of the single-ended operational amplifier 60 respectively, and the output 6406 of the output stage 64 is connected to the output 6006 of the single-ended operational amplifier 60 through the switch S3. Thus, the transconductance amplifier 66 generates the currents I8 and I9 according to the voltage stored in the capacitor C1 to cancel the effect caused by the offset voltage VOS of the single-ended operational amplifier 60. As shown in FIG. 10, since the capacitor C1 is connected between the inputs 6602 and 6604 of the differential input pair of the transconductance amplifier 66, then, even the output voltage VOUT varies, the voltages at the inputs 6602 and 6604 of the transconductance amplifier 66 will vary with the output voltage VOUT of the single-ended operational amplifier 60 so that the voltage difference between the inputs 6602 and 6604 remains constant. Consequently, it is no more needed to switch the single-ended operational amplifier 60 to the offset cancellation mode to repeat the operation of offset cancellation when the output voltage VOUT varies, and therefore the offset cancellation period can be prolonged.

Figure 11:
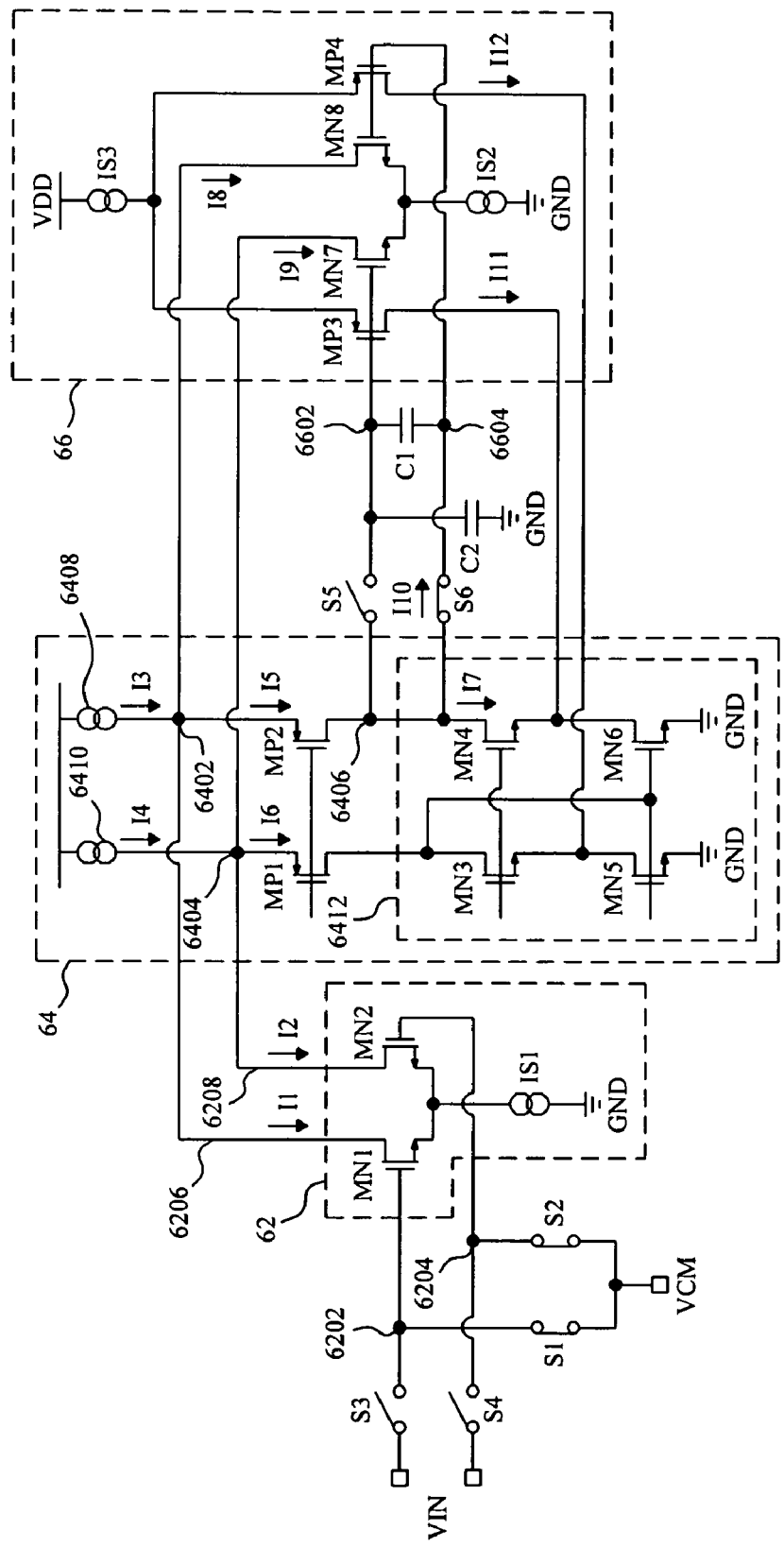
FIG. 11 is a circuit diagram of another embodiment for the transconductance amplifier of FIG. 8 according to the present invention.

FIG. 11 shows another embodiment for the transconductance amplifier 66, which includes a first differential input pair composed of NMOS transistors MN7 and MN8 and a current source IS2, and a second differential input pair composed of PMOS transistors MP3 and MP4 and a current source IS3, so configured that the gates of the transistors MP3 and MN7 are connected to the input 6602, and the gates of the transistors MP4 and MN8 are connected to the input 6604. In this embodiment, when the output voltage VOUT is greater than a threshold, the NMOS transistors MN7 and MN8 are on and the PMOS transistors MP3 and MP4 are off. In this case, the transconductance amplifier 66 sinks currents I8 and I9 from the inputs 6402 and 6406 of the output stage 64 according to the voltage in the capacitor C1 so as to cancel the effect caused by the offset voltage VOS. When the output voltage VOUT is smaller than the threshold, the NMOS transistors MN7 and MN8 are off and the PMOS transistors MP3 and MP4 are on, and as a result, the transconductance amplifier 66 sources currents I11 and I12 to the inputs 6402 and 6404 of the output stage 64 according to the voltage in the capacitor C1 so as to cancel the effect caused by the offset voltage VOS.

Figure 12:
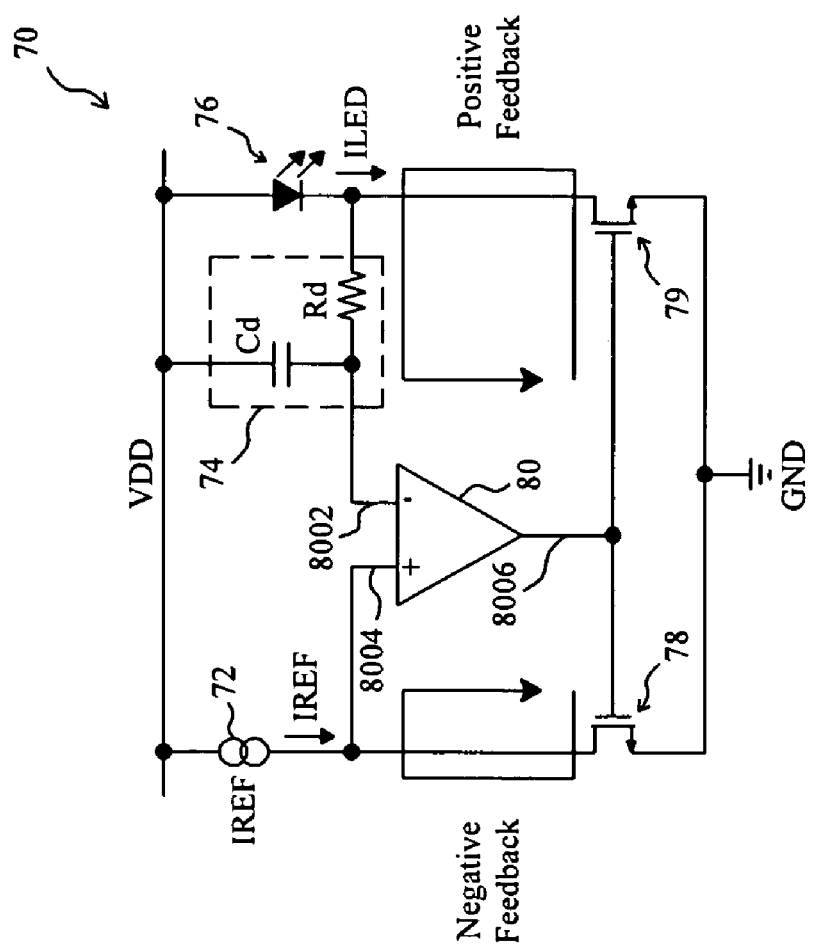
FIG. 12 is a circuit diagram of a current regulator according to the present invention.

FIG. 12 shows a current regulator 70 according to the present invention, which includes a transistor 78 having its drain and gate respectively connected to a non-inverting input 8004 and an output 8006 of a single-ended operational amplifier 80 to establish a negative feedback path, a current source 72 to provide a reference current IREF to the transistor 78, and a transistor 79 having a drain connected to an inverting input 8002 of the single-ended operational amplifier 80 through a delay circuit 74, and a gate connected to the output 8006 of the single-ended operational amplifier 80, to establish a positive feedback path. The transistor 79 determines a load current ILED for a LED 76 according to the current in the transistor 78. The delay circuit 74 is operative to avoid the positive feedback faster than the negative feedback under light load conditions, to maintain the voltages at the drains of the transistors 78 and 79 equal to each other.

Figure 13:
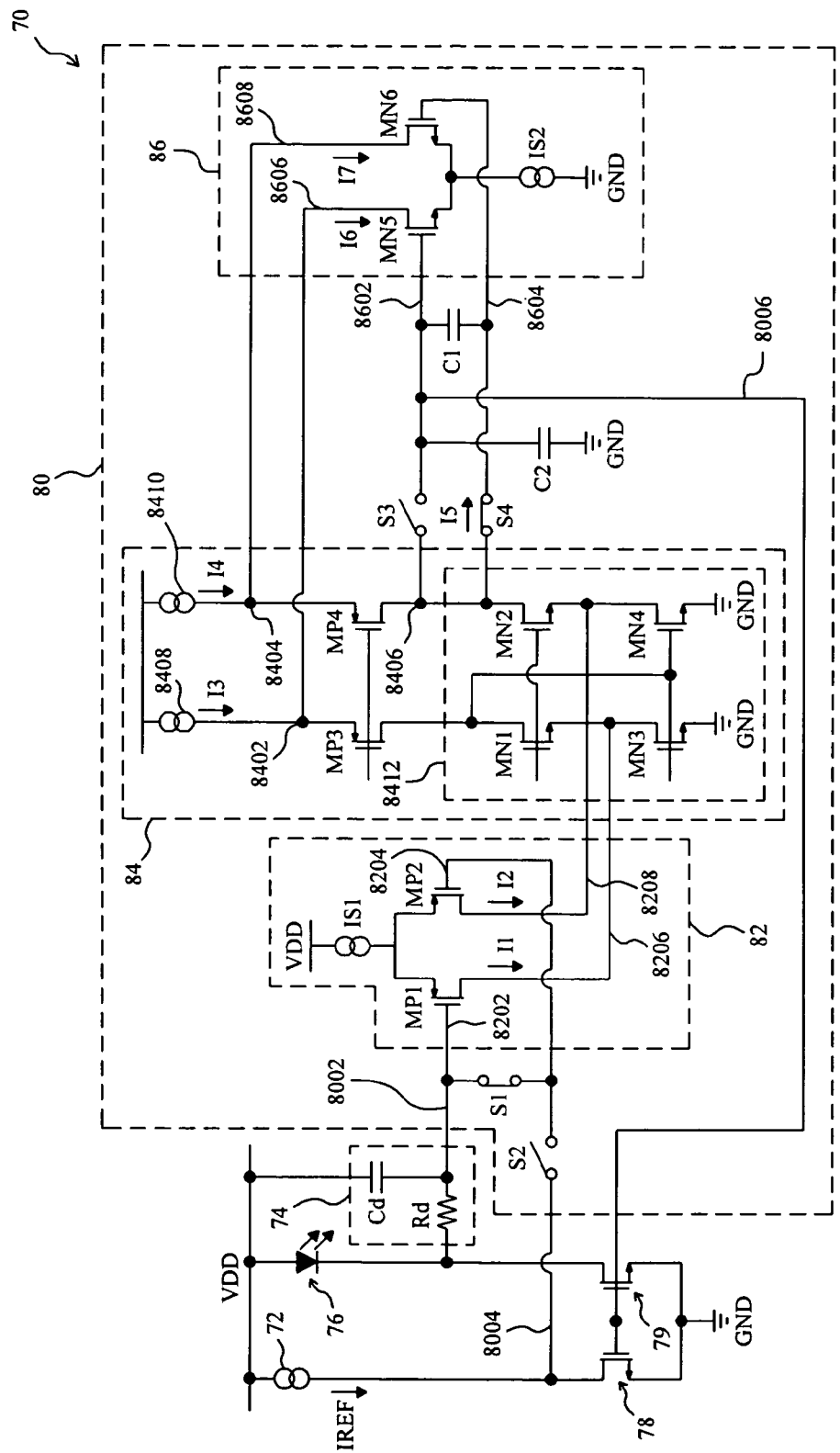
FIG. 13 is a diagram showing further detail circuit of the current regulator of FIG. 12.

The single-ended operational amplifier 80 can switch between a normal operation mode and an offset cancellation mode, and FIG. 13 shows a further detail circuit of the single-ended operational amplifier 80, which includes transconductance amplifiers 82 and 86 and an output stage 84. The transconductance amplifier 82 has a differential input pair composed of transistors MP1 and MP2 and a current source IS1. The input 8202 of the transconductance amplifier 82 is connected to the input 8002 of the single-ended operational amplifier 80, a switch S1 is connected between the inputs 8202 and 8204 of the transconductance amplifier 82, a switch S2 is connected between the input 8204 of the transconductance amplifier 82 and the input 8004 of the single-ended operational amplifier 80, and the outputs 8206 and 8208 of the transconductance amplifier 82 are connected to the inputs 8402 and 8404 of the output stage 84 respectively. The output stage 84 has current sources 8408 and 8410 to source equal currents I3 and I4 to the inputs 8402 and 8404 of the output stage 84 respectively, and a current mirror 8412 having a reference branch and a mirror branch connected to the inputs 8402 and 8406 respectively. A switch S3 is connected between the output 8406 of the output stage 84 and the output 8006 of the single-ended operational amplifier 80, a switch S4 is connected between the output 8406 of the output stage 84 and the input 8604 of the transconductance amplifier 86, and a capacitor C1 is connected between the inputs 8602 and 8604 of the transconductance amplifier 86. The transconductance amplifier 86 has a differential input pair composed of transistors MN5, MN6 and a current source IS2. The outputs 8606 and 8608 of the transconductance amplifier 86 are connected to the inputs 8402 and 8404 of the output stage 84 respectively.

In the offset cancellation mode, the switches S1 and S4 are on and the switches S2 and S3 are off, as shown in FIG. 13. Though the inputs 8202 and 8204 of the transconductance amplifier 82 are connected together through the switch S1, the currents I1 and I2 sourced by the transconductance amplifier 82 are actually unequal to each other due to the offset voltage VOS (not shown). The output stage 84 generates a current I5 according to the difference between the currents I1 and I2 to charge the capacitor C1 through the switch S4. The transconductance amplifier 86 sinks currents I6 and I7 according to the voltage in the capacitor C1 to make currents in the inputs 8402 and 8404 of the output stage 84 equal to each other, thereby canceling the offset voltage VOS of the single-ended operational amplifier 80.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A single-ended operational amplifier having a first mode and a second mode, comprising:
    an output stage having a first input, a second input, and a first output;
    a first transconductance amplifier having a third input, a fourth input, a second output connected to the first input, and a third output connected to the second input;
    a second transconductance amplifier having a fifth input, a sixth input, a fourth output connected to the first input, and a fifth output connected to the second input; and
    a capacitor connected between the fifth input and the sixth input;
    wherein in the first mode, the third input and the fourth input are supplied with a reference voltage, and the first output is connected to the sixth input, so as for offset cancellation for the single-ended operational amplifier; and in the second mode, the third input and the fourth input are connected to two inputs of the single-ended operational amplifier respectively, and the first output is connected to an output of the single-ended operational amplifier.

2. The single-ended operational amplifier of claim 1, wherein the output stage comprises:
    a first current source providing a first current to the first input;
    a second current source providing a second current to the second input; and
    a current mirror having a reference branch and a mirror branch connected to the first input and the second input respectively.

3. The single-ended operational amplifier of claim 1, wherein the first transconductance amplifier comprises a differential input pair establishing a first current and a second current at the second output and the third output, respectively, according to voltages at the third input and the fourth input.

4. The single-ended operational amplifier of claim 1, wherein the second transconductance amplifier comprises a differential input pair establishing a first current and a second current at the fourth output and the fifth output, respectively, according to voltages at the fifth input and the sixth input.

5. The single-ended operational amplifier of claim 1, wherein the second transconductance amplifier comprises:
    a first differential input pair including a first PMOS transistor, a second PMOS transistor and a first current source, in a configuration that the first PMOS transistor has a gate, a drain and a source connected to the fifth input, the fourth output and the first current source respectively, and the second PMOS transistor has a gate, a drain and a source connected to the sixth input, the fifth output and the first current source respectively; and
    a second differential input pair including a first NMOS transistor, a second NMOS transistor and a second current source, in a configuration that the first NMOS transistor has a gate, a drain and a source connected to the fifth input, the fourth output and the second current source respectively, and the second NMOS transistor has a gate, a drain and a source connected to the sixth input, the fifth output and the second current source respectively.

6. An offset cancellation method for a single-ended operational amplifier including an output stage, a first transconductance amplifier and a second transconductance amplifier, the offset cancellation method comprising the steps of:
    supplying a reference voltage to two inputs of the first transconductance amplifier to sink a first current and a second current from two inputs of the output stage respectively;
    according to a difference between the first current and the second current, generating a third current by the output stage to charge a capacitor; and
    according to a voltage in the capacitor, generating a third current and a fourth current at outputs of the second transconductance amplifier respectively, to make currents in the two inputs of the output stage equal to each other.

7. The offset cancellation method of claim 6, wherein the step of generating a third current by the output stage to charge a capacitor comprises the steps of:
    sourcing a fifth current and a sixth current equal to each other to the two inputs of the output stage;
    generating a seventh current equal to a difference between the fifth current and the first current;
    generating an eighth current equal to a difference between the sixth current and the second current; and
    generating the third current equal to a difference between the seventh current and the eighth current.

8. A current regulator comprising:
    a single-ended operational amplifier having a non-inverting input, an inverting input, and an output;
    a first transistor having a gate connected to the output of the single-ended operational amplifier, and a drain connected to the non-inverting input of the single-ended operational amplifier, to thereby establish a negative feedback path;
    a second transistor having a gate connected to the output of the single-ended operational amplifier, and a drain connected to the inverting input of the single-ended operational amplifier, to thereby establish a positive feedback path, and mirroring a current in the first transistor to generate a load current for a load;
    a current source providing a reference current to the first transistor; and
    a delay circuit in the positive feedback path for delaying a positive feedback to avoid the positive feedback faster than a negative feedback.

9. The current regulator of claim 8, wherein the single-ended operational amplifier comprises:
- an output stage having a first input, a second input, and a first output;
- a first transconductance amplifier having a third input, a fourth input, a second output connected to the first input, and a third output connected to the second input;
- a second transconductance amplifier having a fifth input, a sixth input, a fourth output connected to the first input, and a fifth output connected to the second input; and
- a capacitor connected between the fifth input and the sixth input;
- wherein in an offset cancellation mode, the third input and the fourth input are supplied with a reference voltage, and the first output is connected to the sixth input; and in a normal operation mode, the third input and the fourth input are connected to the non-inverting input and the inverting input of the single-ended operational amplifier respectively, and the first output is connected to the output of the single-ended operational amplifier.

10. The current regulator of claim 9, wherein the output stage comprises:
- a first current source providing a first current to the first input;
- a second current source providing a second current to the second input; and
- a current mirror having a reference branch and a mirror branch connected to the first input and the second input respectively.

11. The current regulator of claim 9, wherein the first transconductance amplifier comprises a differential input pair having the third input, the fourth input, the second output, and the third output.

12. The current regulator of claim 9, wherein the second transconductance amplifier comprises a differential input pair having the fifth input, the sixth input, the fourth output, and the fifth output.

* * * * *